United States Patent
Tsai et al.

(10) Patent No.: US 10,763,162 B2
(45) Date of Patent: Sep. 1, 2020

(54) INTERCONNECT STRUCTURE OF SEMICONDUCTOR DEVICE

(71) Applicant: Taiwan Semiconductor Manufacturing Company, Ltd., Hsinchu (TW)

(72) Inventors: Chia-Ching Tsai, Tainan (TW); Yi-Wei Chiu, Kaohsiung (TW); Li-Te Hsu, Shanhua Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/423,504

(22) Filed: May 28, 2019

(65) Prior Publication Data

US 2019/0279898 A1 Sep. 12, 2019

Related U.S. Application Data

(63) Continuation of application No. 15/587,140, filed on May 4, 2017, now Pat. No. 10,304,729.

(60) Provisional application No. 62/427,590, filed on Nov. 29, 2016.

(51) Int. Cl.
*H01L 21/768* (2006.01)

(52) U.S. Cl.
CPC .. *H01L 21/76832* (2013.01); *H01L 21/76804* (2013.01); *H01L 21/76807* (2013.01); *H01L 21/76813* (2013.01); *H01L 21/76834* (2013.01); *H01L 21/76879* (2013.01)

(58) Field of Classification Search
None
See application file for complete search history.

(56) References Cited

U.S. PATENT DOCUMENTS

| 6,586,842 B1 * | 7/2003 | You ................... H01L 21/76804 257/758 |
|---|---|---|
| 6,716,733 B2 | 4/2004 | Lee et al. |
| 6,800,554 B2 | 10/2004 | Marieb et al. |
| 6,977,220 B2 | 12/2005 | Marieb et al. |
| 7,101,790 B2 | 9/2006 | Lee et al. |
| 7,220,674 B2 | 5/2007 | Marieb et al. |
| 7,229,922 B2 | 6/2007 | Dubin et al. |
| 2012/0119184 A1 * | 5/2012 | Hsu ........................ H01L 33/22 257/13 |
| 2012/0285198 A1 | 11/2012 | Shang |
| 2014/0077147 A1 | 3/2014 | Tong et al. |
| 2014/0312419 A1 | 10/2014 | Adam et al. |

* cited by examiner

*Primary Examiner* — Anthony Ho
*Assistant Examiner* — Kevin Quinto
(74) *Attorney, Agent, or Firm* — Slater Matsil, LLP

(57) ABSTRACT

A device includes a substrate, a first dielectric layer over the substrate, a first conductive feature in the first dielectric layer, and an etch stop layer over the first dielectric layer. The etch stop layer includes metal-doped aluminum nitride. The device further includes a second dielectric layer over the etch stop layer, and a second conductive feature in the second dielectric layer. The second conductive feature extends into the etch stop layer and contacts the first conductive feature.

20 Claims, 8 Drawing Sheets

INTERCONNECT STRUCTURE OF SEMICONDUCTOR DEVICE

PRIORITY CLAIM AND CROSS-REFERENCE

This application is a continuation of U.S. application Ser. No. 15/587,140, filed on May 4, 2017, entitled "Method of Forming Interconnect Structures," which claims the benefit of U.S. Provisional Application No. 62/427,590, filed on Nov. 29, 2016, entitled "Method of Forming Interconnect Structures," which applications are hereby incorporated herein by reference.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
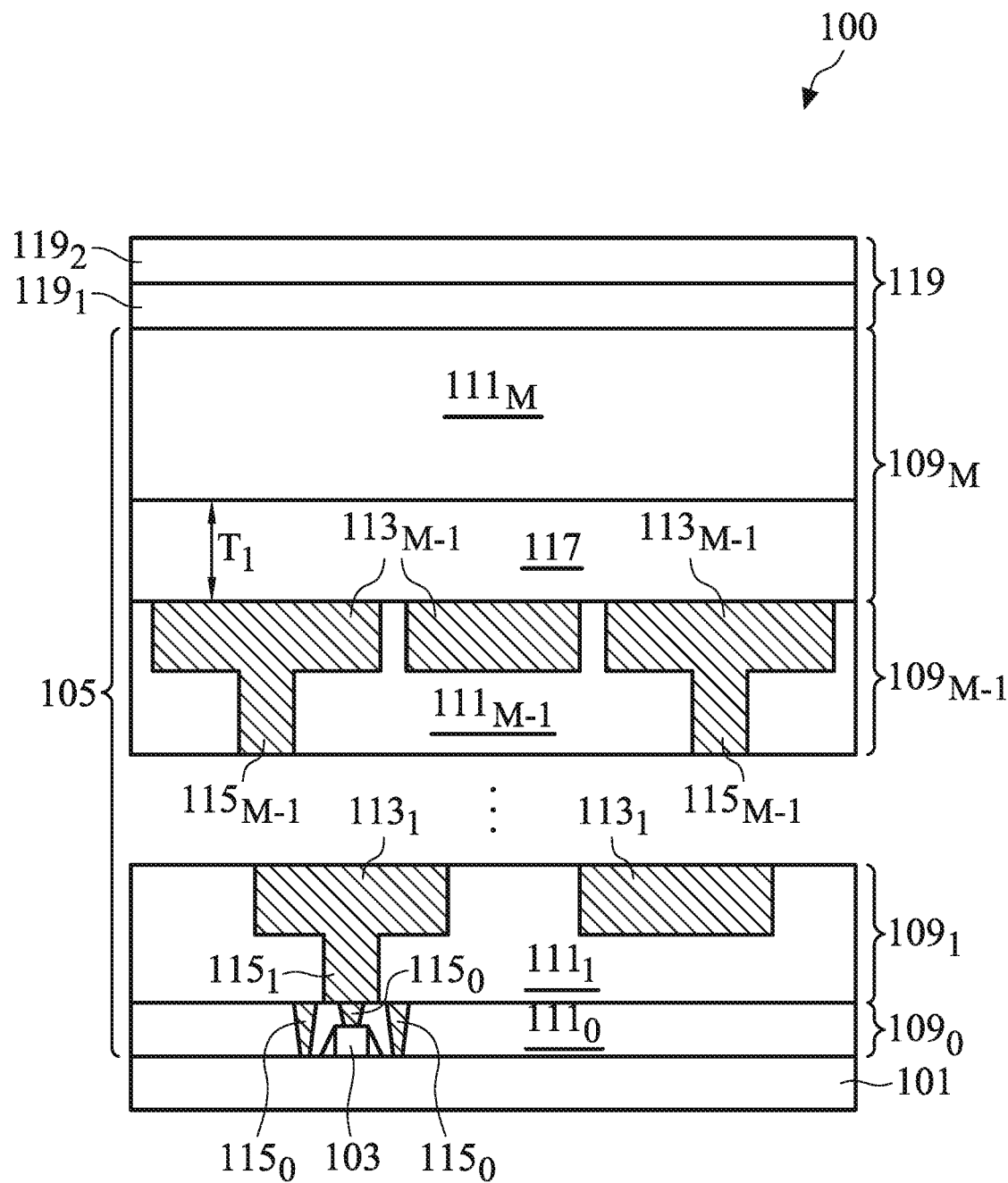
FIGS. 1-7 illustrate cross-sectional views of various intermediate stages of fabrication of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a method of forming interconnects in a semiconductor structure. Various embodiments discussed herein allow for preventing oxidation/corrosion of interconnects and allow for preventing formation of hydride and hydroxyl impurities within interconnects.

Referring to FIG. 1, a portion of the semiconductor structure 100 is illustrated. The semiconductor structure 100 may be an intermediate structure of an integrated circuit manufacturing process. In some embodiments, the semiconductor structure 100 may comprise a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 105 is formed over the one or more active and/or passive devices 103 and the substrate 101. The interconnect structure 105 electrically interconnects the one or more active and/or passive devices 103 to form functional electrical circuits within the semiconductor structure 100. The interconnect structure 105 may comprise one or more metallization layers $109_0$ to $109_M$, wherein M+1 is the number of the one or more metallization layers $109_0$ to $109_M$. In some embodiments, the value of M may vary according to design specifications of the semiconductor structure 100. In what follows, the one or more metallization layers $109_0$ to $109_M$ may also be collectively referred to as the one or more metallization layers 109. The one or more metallization layers $109_0$ to $109_M$, comprise one or more dielectric layers $111_0$ to $111_M$, respectively.

In some embodiments, the dielectric layer $111_0$ is an inter-layer dielectric (ILD) layer, and the dielectric layers $111_1$ to $111_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, the dielectric layers $111_0$ comprises conductive plugs $115_0$, and the dielectric layers $111_1$ to $111_{M-1}$ comprise one or more conductive interconnects, such as conductive lines $113_1$ to $113_{M-1}$ and conductive vias $115_1$ to $115_{M-1}$, respectively. The conductive plugs $115_0$ electrically couple the one or more active and/or passive devices 103 to the conductive lines $113_1$ to $113_{M-1}$ and the conductive vias $115_1$ to $115_{M-1}$. As described below in greater detail, conductive lines $113_M$ and conductive vias $115_M$ (not illustrated in FIG. 1, see FIG. 7) are formed in the dielectric layer $111_M$.

In some embodiments, the conductive plugs $115_0$, the conductive lines $113_1$ to $113_{M-1}$ and the conductive vias $115_1$ to $115_{M-1}$ may be formed using any suitable method, such as damascene, dual damascene, or the like. The conductive plugs $115_0$, the conductive lines $113_1$ to $113_{M-1}$ and the conductive vias $115_1$ to $115_{M-1}$ may comprise conductive materials such as copper, aluminum, tungsten, combinations thereof, or the like. The conductive plugs $115_0$, the conductive lines $113_1$ to $113_{M-1}$ and the conductive vias $115_1$ to $115_{M-1}$ may further comprise one or more barrier/adhesion layers (not shown) to protect the respective dielectric layers $111_0$ to $111_{M-1}$ from diffusion and metallic poisoning. The one or more barrier/adhesion layers may comprise titanium, titanium nitride, tantalum, tantalum nitride, a combination thereof, or the like, and may be formed using physical vapor deposition (PVD), CVD, atomic layer deposition (ALD), a combination thereof, or the like. In an embodiment, the steps for forming the conductive plugs $115_0$, the conductive lines $113_1$ to $113_{M-1}$ and the conductive vias $115_1$ to $115_{M-1}$ may include forming openings in the respective dielectric layers $111_0$ to $111_{M-1}$, depositing barrier/adhesion layers in the openings, depositing seed layers of a suitable conductive material over barrier/adhesion layers, and filling the openings with a suitable conductive material, for example, by plating, or other suitable methods. A chemical mechanical polishing (CMP) is then performed to remove excess materials overfilling the openings.

In some embodiments, etch stop layers (not shown) may be formed between adjacent ones of the dielectric layers $111_0$ to $111_M$. In the illustrated embodiment, such an etch stop layer (ESL) 117 is formed between the dielectric layers $111_{M-1}$ and $111_M$. The etch stop layers aid in patterning the dielectric layers $111_0$ to $111_M$ to form openings in the dielectric layers $111_0$ to $111_M$. A material for the etch stop layers is chosen such that etch rates of the etch stop layers are less then etch rates of corresponding ones of the dielectric layers $111_0$ to $111_M$, and such that the etch stop layers have a good adhesion with the corresponding ones of the dielectric layers $111_0$ to $111_M$. In the illustrated embodiment, an etch rate of the ESL 117 is less than an etch rate of the dielectric layer $111_M$. As described below in greater detail, the ESL 117 is used for preventing oxidation/corrosion of the conductive lines $113_{M-1}$ and for preventing formation of hydride and hydroxyl impurities within the conductive lines $113_{M-1}$.

In some embodiments, the ESL 117 may comprise metal-doped aluminum nitride (Al(M)N), where the metallic element M may include Cr, Al, Ti, Sn, Zn, Mg, Ag, or the like, and may be epitaxially deposited using CVD, PECVD, a combination thereof, or the like. In some embodiments, a thickness $T_1$ of the ESL 117 may be between about 100 nm and about 200 nm. In some embodiments, Al(M)N is in situ doped by using appropriate precursors for the metallic element M during the deposition. In alternative embodiments, Al(M)N may be formed by depositing AlN over the dielectric layer $111_M$ and the conductive lines $113_{M-1}$, and subsequently doping AlN with the metallic element M using, for example, an implantation method. In some embodiments, an atomic percentage of the metallic element M in Al(M)N is between about 5% and about 10%. By choosing such a percentage of the metallic element M in Al(M)N, the etch selectivity and adhesion properties of Al(M)N are improved compared to MN, without significantly affecting a conductivity of Al(M)N, such that Al(M)N provides sufficient insulating capabilities between adjacent conductive features, such as adjacent conductive lines $113_{M-1}$ and subsequently formed adjacent conductive vias $115_M$ (see FIG. 7).

In alternative embodiments, the ESL 117 may comprise one or more layers of dielectric materials such as oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), combinations thereof, or the like, and may be formed using spin-on coating, CVD, PECVD, ALD, a combination thereof, or the like.

Referring further to FIG. 1, a mask stack 119 is formed over the dielectric layer $111_M$. As described below in greater detail, the mask stack 119 is used to aid in patterning of the dielectric layer $111_M$. In some embodiments, the mask stack 119 comprises one or more mask layers. In the illustrated embodiment, the mask stack 119 comprises a first mask layer $119_1$, and a second mask layer $119_2$ over the first mask layer $119_1$. In some embodiments, a thickness of the first mask layer $119_1$ may be between about 150 nm and about 200 nm. In some embodiments, the first mask layer $119_1$ includes a dielectric material, such as silicon oxide, silicon nitride, silicon oxynitride, silicon carbide, silicon carbonitride, a combination thereof, or the like, and may be formed using an oxidation process, ALD, CVD, PVD, a combination thereof, or the like. Accordingly, the first mask layer $119_1$ may be also referred to as a dielectric mask layer $119_1$. In some embodiments, the first mask layer $119_1$ may act as an anti-reflective coating (ARC) and may be also referred to as an ARC $119_1$.

In some embodiments, the first mask layer $119_1$ comprises silicon carbide, which is doped with oxygen (O) and nitrogen (N). Contents of carbon and nitrogen in the first mask layer $119_1$ may be tuned to achieve desired etching characteristics for the first mask layer $119_1$. In some embodiments, the first mask layer $119_1$ is substantially free from nitrogen. In such embodiments, the first mask layer $119_1$ may be also referred to as a nitrogen-free ARC (NFARC) $119_1$.

In some embodiments, the second mask layer $119_2$ may comprise a metal nitride compound, such as titanium nitride (TiN), tantalum nitride (TaN), or the like, and may be formed using CVD, PECVD, ALD, a combination thereof, or the like. Accordingly, the second mask layer $119_2$ may be also referred to as a metal mask layer $119_2$. In some embodiments, a thickness of the second mask layer $119_2$ may be between about 150 nm and about 200 nm. In alternative embodiments, the first mask layer $119_1$ of the mask stack 119 may be omitted. In such embodiments, the mask stack 119 may comprise a layer of a nitride material.

Figure 2:
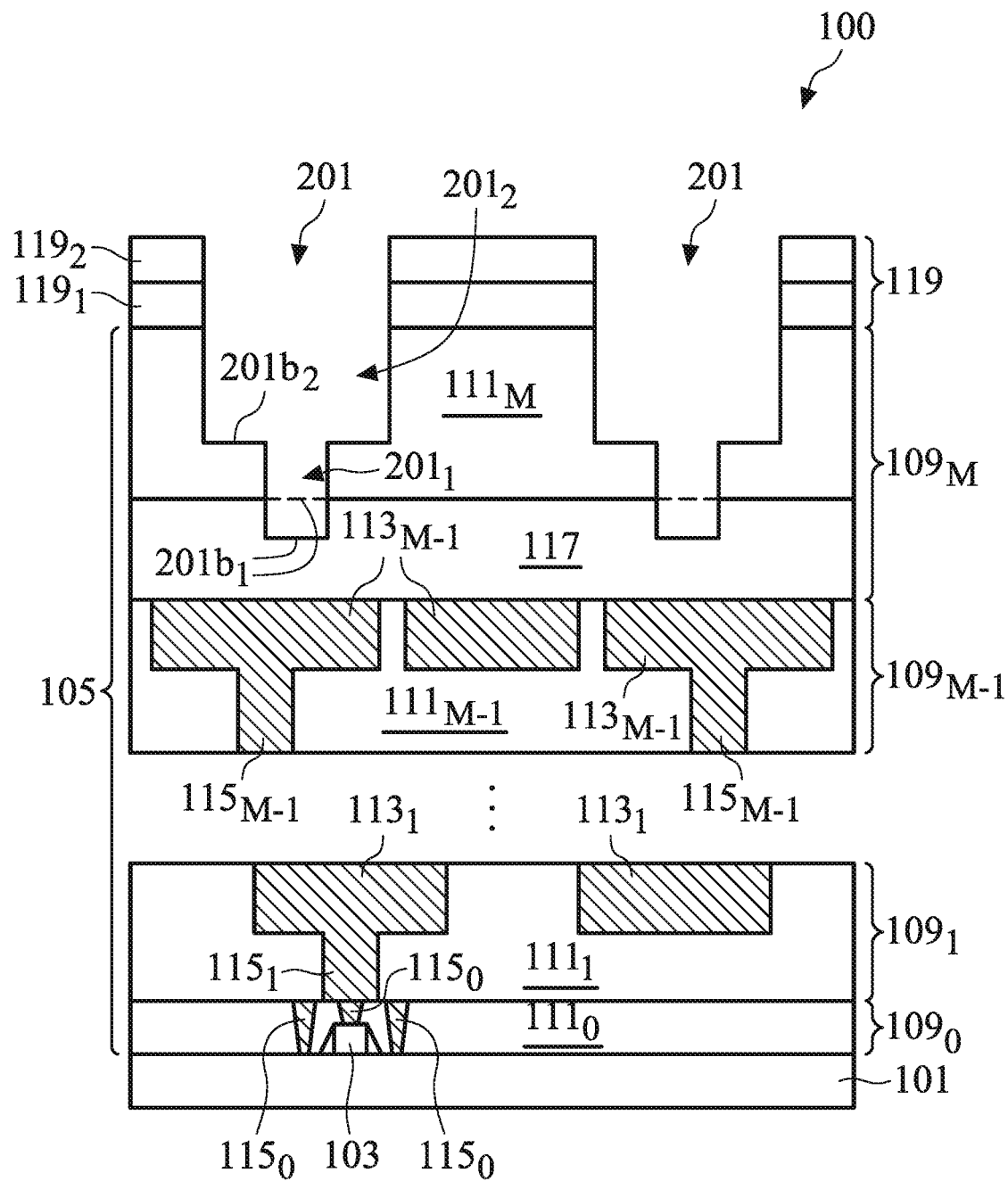

Referring to FIG. 2, the mask stack 119 and the dielectric layer $111_M$ are patterned to form openings 201 in the dielectric layer $111_M$. The openings 201 comprise lower portions $201_1$, which may be also referred to as via openings $201_1$, and upper portions $201_2$, which may be also referred to as line openings $201_2$. In some embodiments, the openings 201 may be formed by a "via first" process. In other embodiments, the openings 201 may be formed by a "trench first" process.

In some embodiments when the openings 201 are formed using a "via first" process, the via openings $201_1$ are formed before forming the line openings $201_2$. In some embodiments, a first patterned mask (not shown) is formed on the second mask layer $119_2$. A material of the first patterned mask is deposited on the second mask layer $119_2$. The material of the first patterned mask is then irradiated (exposed), cured, and developed to remove a portion of the material of the first patterned mask, thereby forming the first patterned mask. In some embodiments, the first patterned mask may comprise a photoresist, or any suitable photo-patternable material.

In some embodiments, the first patterned mask is used to pattern the first mask layer $119_1$, the second mask layer $119_2$, and the dielectric layer $111_M$, and form the via openings $201_1$. Portions of the first mask layer $119_1$, the second mask layer $119_2$, and the dielectric layer $111_M$ unprotected by the first patterned mask are etched using a first etch process. In some embodiments, the first etch process may comprise one or more suitable etch processes, such as, for example, an anisotropic dry etch process, or the like. In an embodiment, the first etch process includes a reactive ion etch (RIE) process performed with processes gasses such as $C_4F_8$, $CH_2F_2$, $CF_4$, $O_2$, $N_2$, Ar, the like, or mixtures thereof. In an embodiment, a process gas mixture of a RIE process includes process gases that chemically etch the first mask layer $119_1$, the second mask layer $119_2$, and the dielectric layer $111_M$. In some embodiments, the entire first patterned mask may be fully consumed prior to completion of the first etch process. In such embodiments, the first mask layer $119_1$ and the second mask layer $119_2$ are used as an etch mask to complete the first etch process.

In some embodiments, the first etch process stops when the via openings $201_1$ reach the ESL 117, such that bottoms $201b_1$ of the via openings $201_1$ expose portions of the ESL 117. In alternative embodiments, the first etch process stops before the via openings $201_1$ reach the ESL 117. In such embodiments, the bottoms $201b_1$ of the via openings $201_1$ expose portions of the dielectric layer $111_M$. Subsequently, remaining portions of the first patterned mask, if any, are removed. In some embodiments when the first patterned mask is formed of a photoresist material, the remaining portions of the first patterned mask may be removed using, for example, an ashing process in combination with a wet clean process.

After forming the via openings $201_1$, the line openings $201_2$ are formed in the dielectric layer $111_M$. In some embodiments, a second patterned mask (not shown) is formed on the second mask layer $119_2$. A material of the second patterned mask is deposited on the second mask layer $119_2$. The material of the second patterned mask is then irradiated (exposed), cured, and developed to remove a portion of the material of the second patterned mask, thereby forming the second patterned mask. In some embodiments, the second patterned mask may comprise a photoresist, or any suitable photo-patternable material.

In some embodiments, the second patterned mask is used to pattern the first mask layer $119_1$, the second mask layer $119_2$, and the dielectric layer $111_M$, and to form the line openings $201_2$. Portions of the first mask layer $119_1$, the second mask layer $119_2$, and the dielectric layer $111_M$ unprotected by the second patterned mask are etched using a second etch process. In some embodiments, the second etch process may comprise one or more suitable etch processes, such as, for example, an anisotropic dry etch process, or the like. In an embodiment, the second etch process includes a RIE process performed with processes gasses such as $C_4F_8$, $CH_2F_2$, $CF_4$, $O_2$, $N_2$, Ar, the like, or mixtures thereof. In an embodiment, a process gas mixture of a RIE process includes process gases that chemically etch the first mask layer $119_1$, the second mask layer $119_2$, and the dielectric layer $111_M$. In some embodiments, the first etch process and the second etch process may be performed with different mixtures of process gases. In other embodiments, the first etch process and the second etch process may be performed with a same mixtures of process gases. In some embodiments, the entire second patterned mask may be fully consumed prior to completion of the second etch process. In such embodiments, the first mask layer $119_1$ and the second mask layer $119_2$ are used as an etch mask to complete the second etch process.

In some embodiments, the second etch process may further extend the via openings $201_1$. In some embodiments when the ESL 117 is not exposed after the first etch process, the second etch process further etches the dielectric layer $111_M$, such that the bottoms $201b_1$ of the via openings $201_1$ (shown by dashed lines in FIG. 2) expose portions of the ESL 117. In other embodiments when the ESL 117 is exposed after the first etch process, the second etch process etches the ESL 117, such that the via openings $201_1$ partially extend into the ESL 117. In such embodiments, the bottoms $201b_1$ of the via openings $201_1$ are disposed within the ESL 117 below a topmost surface of the ESL 117. Subsequently, remaining portions of the second patterned mask, if any, are removed. In some embodiments when the second patterned mask is formed of a photoresist material, the remaining portions of the second patterned mask may be removed using, for example, an ashing process in combination with a wet clean process.

Referring further to FIG. 2, in alternative embodiments, the openings 201 are formed using a "trench first" process. In such embodiments, formation process of the openings 201 is similar to the "via first process" described above with a distinction that the line openings $201_2$ are formed before forming the via openings $201_1$.

Figure 3:
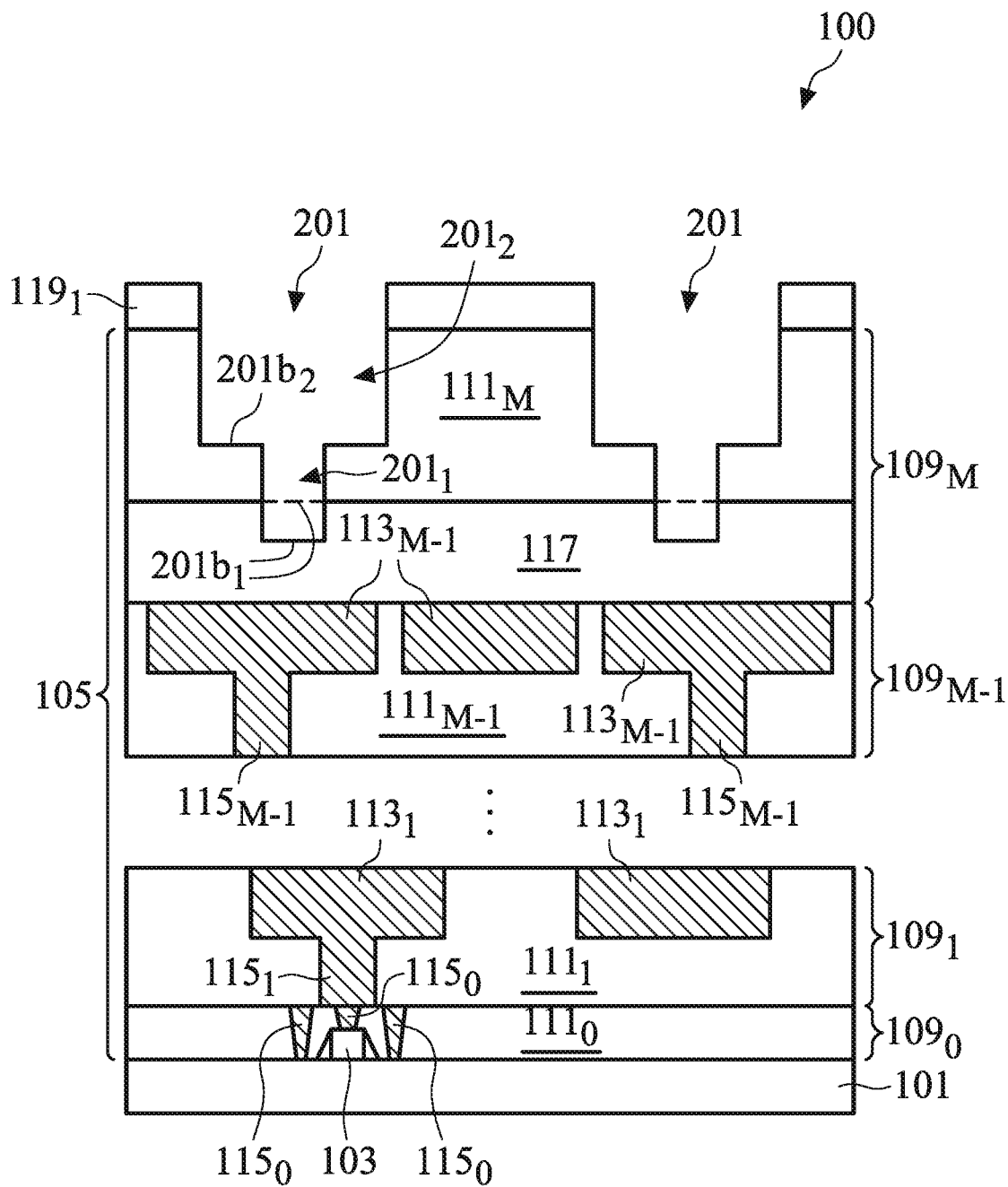

Referring to FIG. 3, the second mask layer $119_2$ of the mask stack 119 is removed from the semiconductor structure 100. In some embodiments, the second mask layer $119_2$ is removed using, for example, a blanket etch process. In some embodiments in which the second mask layer $119_2$ is formed of TiN, a wet etch process with a solution comprising ammonium hydroxide ($NH_4OH$), hydrogen peroxide ($H_2O_2$) and deionized water ($H_2O$) may be used to remove the second mask layer $119_2$. In other embodiments, other suitable removal processes may be used to remove the second mask layer $119_2$. In some embodiments, the first mask layer $119_1$ remains on the dielectric layer $111_M$ to protect the dielectric layer $111_M$ from a damage (e.g., plasma damage) induced by a subsequent etch process. Furthermore, as described below in greater detail, the first mask layer $119_1$ acts as an etch mask for a subsequent etch process.

Figure 4:
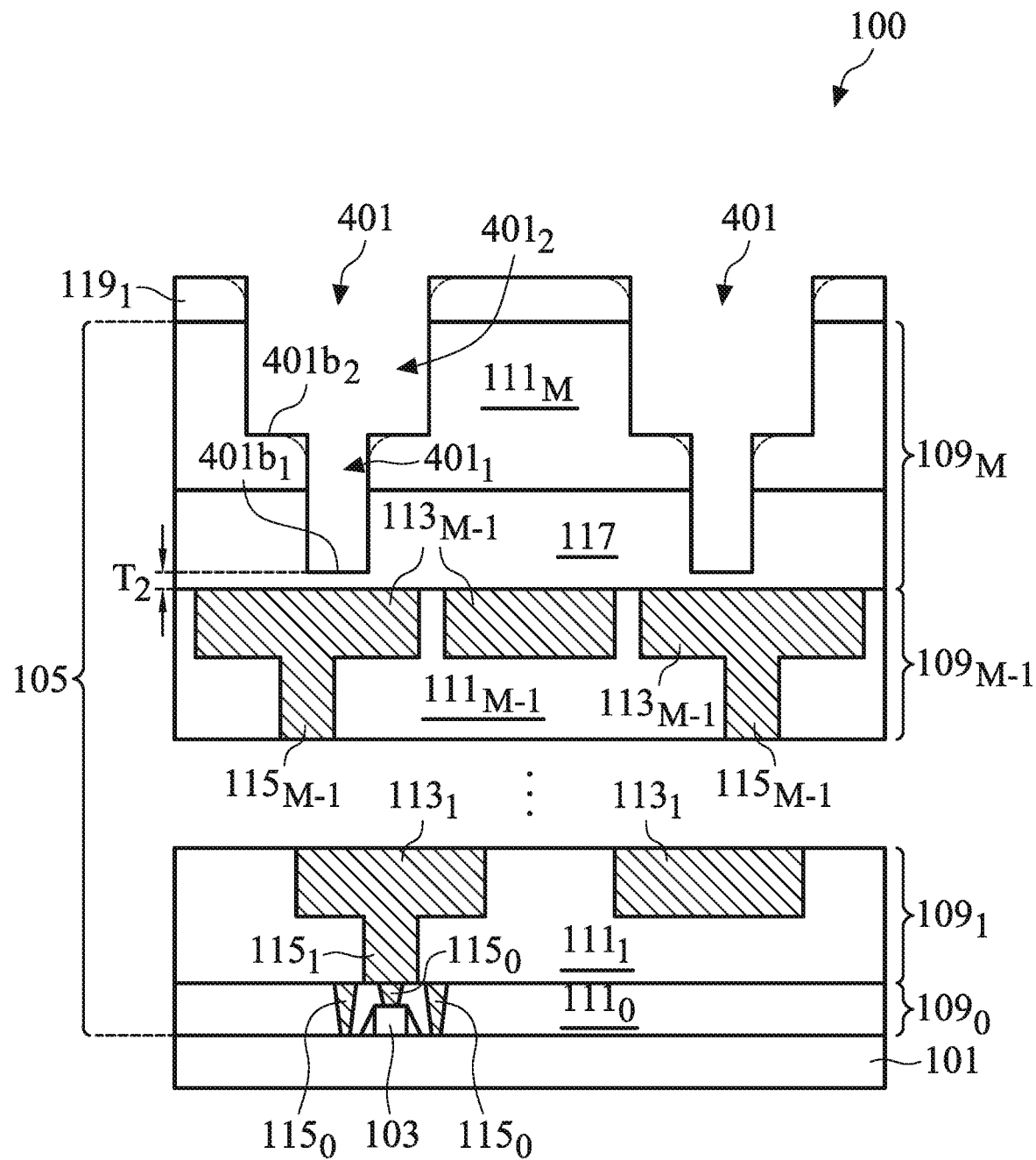

Referring to FIG. 4, a third etch process is performed on the semiconductor structure 100 to extend the openings 201 (see FIG. 3) towards the metallization layer $109_{M-1}$, thereby forming openings 401. The openings 401 comprise lower portions $401_1$, which may also be referred to as via openings $401_1$, and upper portions $401_2$, which may also be referred to as line openings $401_2$. The via openings $401_1$ correspond to the via openings $201_1$ (see FIG. 3), and the line openings $401_2$ correspond to the line openings $201_2$ (see FIG. 3). In some embodiments, the third etch process removes portions of the dielectric layer $111_M$ disposed below the bottoms $201b_2$ of the line openings $201_2$ (see FIG. 3) and portions of the ESL 117 disposed below the bottoms $201b_1$ of the via openings $201_1$ (see FIG. 3). Accordingly, the bottoms $401b_1$ of the via openings $401_1$ are lower than the bottoms $201b_1$ of the via openings $201_1$, and the bottoms $401b_2$ of the line openings $401_2$ are lower than the bottoms $201b_2$ of the line openings $201_2$. Furthermore, the third etch process may also round corners of the openings 401 (illustrated by dashed lines in FIG. 4), such that the bottoms $401b_2$ of the line openings $401_2$ may smoothly join sidewalls of the via openings $401_1$. In some embodiments, the third etch process may comprise one or more suitable etch processes, such as an anisotropic dry etch process, or the like. In an embodiment, the third etch process includes a RIE process performed with processes gasses such as $C_4F_8$, $CH_2F_2$, $CF_4$, $O_2$, $N_2$, Ar, the like, or mixtures thereof. In an embodiment, a process gas mixture of a RIE process includes process gases that chemically etch the second mask layer $119_2$, the dielectric layer $111_M$, and the ESL 117. In some embodiments, the third etch process and the first etch process may be performed with different mixtures of process gases. In other embodiments, the third etch process and the second etch process may be performed with different mixtures of process gases.

Referring further to FIG. 4, in the illustrated embodiment, a least a portion of the ESL 117 remains interposed between the bottoms $401b_1$ of the via openings $401_1$ and the conductive lines $113_{M-1}$, such that the conductive lines $113_{M-1}$ are not exposed by the via openings $401_1$. By not exposing the conductive lines $113_{M-1}$ during the third etch process, oxidation/corrosion of the conductive lines $113_{M-1}$ and formation of hydride and hydroxyl impurities within the conductive lines $113_{M-1}$ may be prevented. In some embodiments, portions of the ESL 117 interposed between the bottoms $401b_1$ of the via openings $401_1$ and the conductive lines $113_{M-1}$ may have a thickness $T_2$ between about 0.1 Å and about 0.5 Å. In some embodiments, such a range for the thickness $T_2$ allows for protecting the conductive lines $113_{M-1}$ from oxidation/corrosion and form formation of hydride and hydroxyl impurities.

Figure 5:
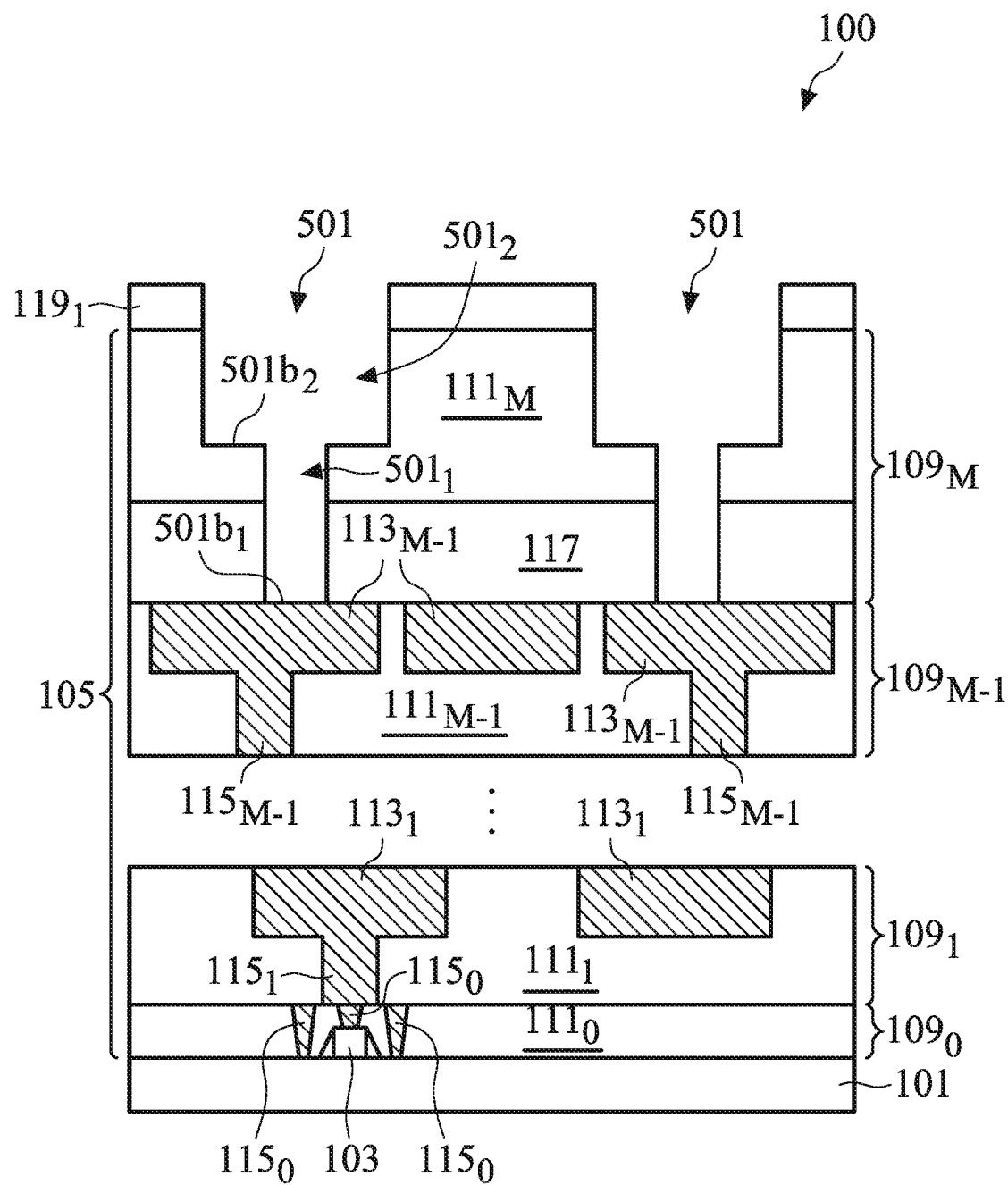

Referring to FIG. 5, the portions of the ESL 117 interposed between the bottoms $401b_1$ of the via openings $401_1$ (see FIG. 4) and the conductive lines $113_{M-1}$ are removed to expose underlying conductive lines $113_{M-1}$, thereby forming openings 501. The openings 501 comprise lower portions $501_1$, which may also be referred to as via openings $501_1$, and upper portions $501_2$, which may also be referred to as line openings $501_2$. The via openings $501_1$ correspond to the via openings $401_1$ (see FIG. 4), and the line openings $501_2$ correspond to the line openings $401_2$ (see FIG. 4), with bottoms $501b_1$ of the via openings $501_1$ being lower than the bottoms $401b_1$ of the via openings $401_1$ (see FIG. 4). In some embodiments, the removal process for the ESL 117 may not substantially remove the dielectric layer $111_M$. In such embodiments, bottoms $501b_2$ of the line openings $501_2$ may be approximately at a same level as the bottoms $401b_2$ of the line openings $401_2$ (see FIG. 4). In alternative embodiments, the removal process for the ESL 117 may also remove portions of the dielectric layer $111_M$. In such embodiments, the bottoms $501b_2$ of the line openings $501_2$ may be lower than the bottoms $401b_2$ of the line openings $401_2$ (see FIG. 4).

Referring further to FIG. 5, in some embodiments, the portions of the ESL 117 interposed between the bottoms $401b_1$ of the via openings $401_1$ (see FIG. 4) and the conductive lines $113_{M-1}$ may be removed by sputtering, ion milling, or the like. The sputtering process may be performed by bombarding the desired portions of the ESL 117 with ions of an inert (non-reactive) gas, such as Argon (Ar), Nitrogen ($N_2$), a mixture thereof, or the like. In an embodiment, a process gas mixture of a sputtering process does not include process gases that chemically etch the ESL 117. By using inert gases to expose the conductive lines $113_{M-1}$, oxidation/corrosion of the conductive lines $113_{M-1}$ may be prevented. In alternative embodiments, the portions of the ESL 117 interposed between the bottoms $401b_1$ of the via openings $401_1$ (see FIG. 4) and the conductive lines $113_{M-1}$ may be removed using other suitable removal processes, which does not oxidize the conductive lines $113_{M-1}$.

Figure 6:
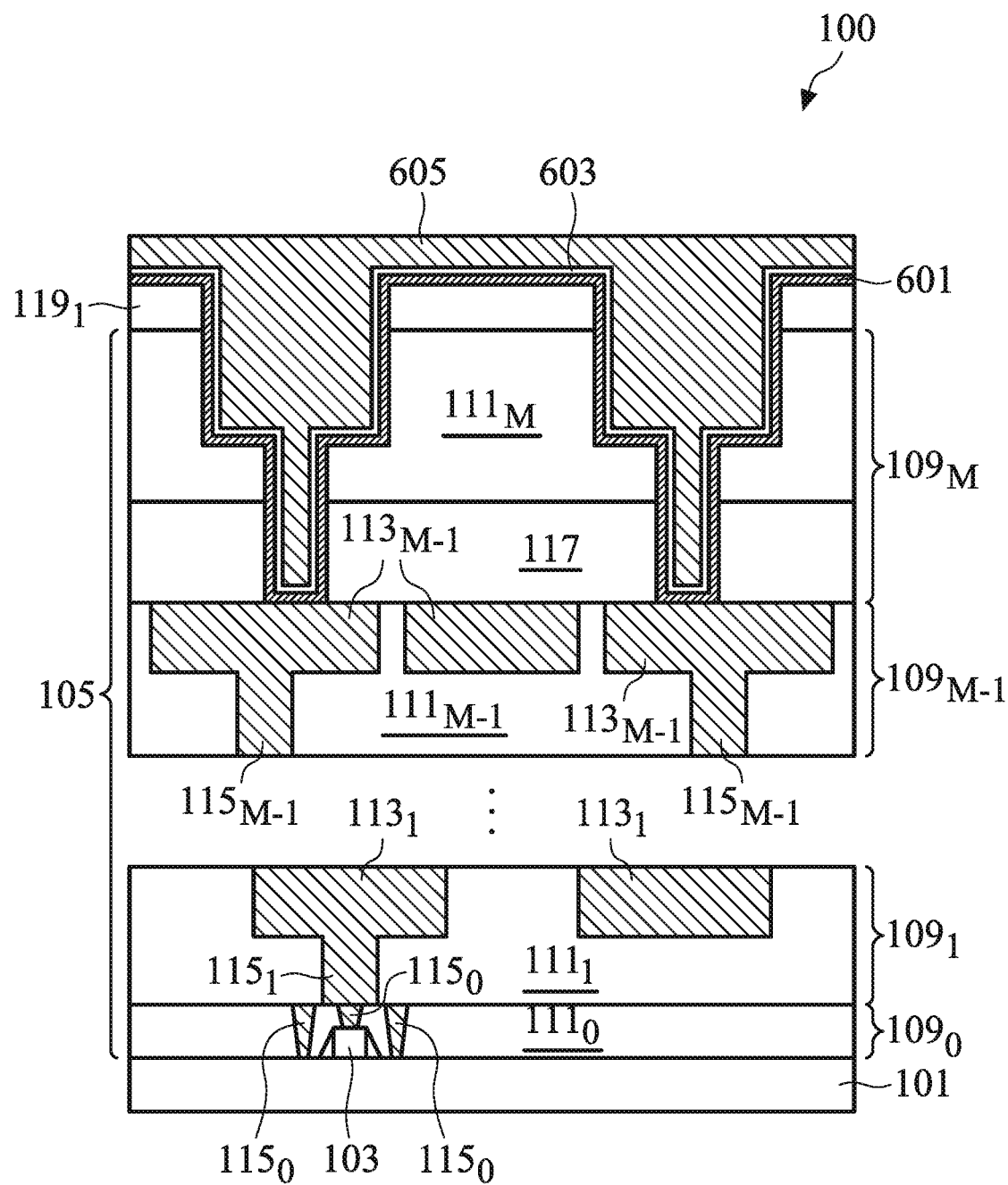
Figure 7:
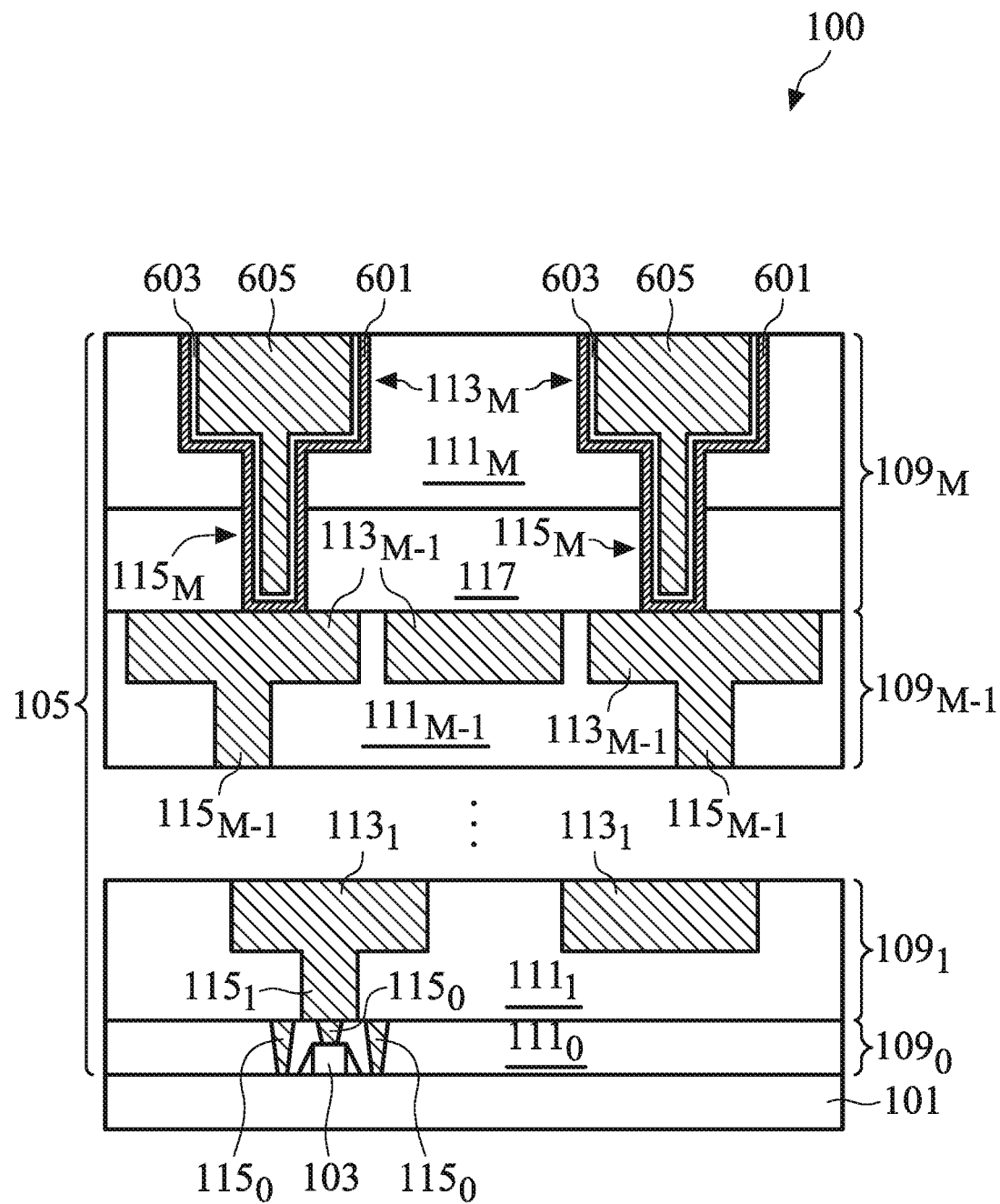

Referring to FIG. 6, the openings 501 (see FIG. 5) are filled with suitable conductive materials to form the conductive lines $113_M$ and the conductive vias $115_M$ (see FIG. 7). In some embodiments, one or more barrier/adhesion layers 601 are formed on bottoms and sidewalls of the openings 501. The one or more barrier/adhesion layers 601 protect the dielectric layer $111_M$ from diffusion and metallic poisoning. In some embodiments, the one or more barrier/adhesion layers 601 may comprise titanium, titanium nitride, tantalum, tantalum nitride, a combination thereof, or the like, and may be formed using PVD, CVD, ALD, a combination thereof, or the like.

In some embodiments, a seed layer 603 is formed over the one or more barrier/adhesion layers 601. The seed layer 603 may comprise copper, titanium, nickel, gold, manganese, a combination thereof, or the like, and may be formed by ALD, CVD, PVD, sputtering, a combination thereof, or the like. Subsequently, the openings 501 are filled with a conductive material 605. The conductive material 605 may comprise copper, aluminum, tungsten, combinations thereof, alloys thereof, or the like, and may be formed using, for example, by plating, or other suitable methods.

Referring to FIG. 7, portions of the one or more barrier/adhesion layers 601, the seed layer 603 and the conductive material 605 overfilling the openings 501 (see FIGS. 5 and 6) are removed to expose a top surface of the dielectric layer $111_M$. In some embodiments, the portions of the one or more barrier/adhesion layers 601, the seed layer 603 and the conductive material 605 overfilling the openings 501 may be removed using a CMP process, a grinding process, an etching process, a combination thereof, or the like. Remaining portions of the one or more barrier/adhesion layers 601, the seed layer 603 and the conductive material 605 filling the via openings $501_1$ (see FIGS. 5 and 6) form conductive vias $115_M$, and remaining portions of the one or more barrier/adhesion layers 601, the seed layer 603 and the conductive material 605 filling the line openings $501_2$ (see FIGS. 5 and 6) form conductive lines $113_M$.

In some embodiments, the metallization layer $109_M$ may be the last metallization layer of the interconnect structure 105 and the formation of the metallization layer $109_M$ completes the formation of the interconnect structure 105. In other embodiments, the metallization layer $109_M$ may be an intermediate metallization layer of the interconnect structure 105. In such embodiments, additional metallization layers are formed over the metallization layer $109_M$ until the formation of the interconnect structure 105 is completed. In some embodiments, further processing steps may be performed on the semiconductor structure 100 after the formation of the interconnect structure 105 is completed. The further processing steps may include formation of contact pads and one or more passivation layers over the interconnect structure 105, formation of under-bump metallizations (UBMs) over the contact pads, and formation of connectors over the UBMs. Subsequently, the semiconductor structure 100 may be singulated into separate dies, which may further undergo various packaging processes.

Figure 8:
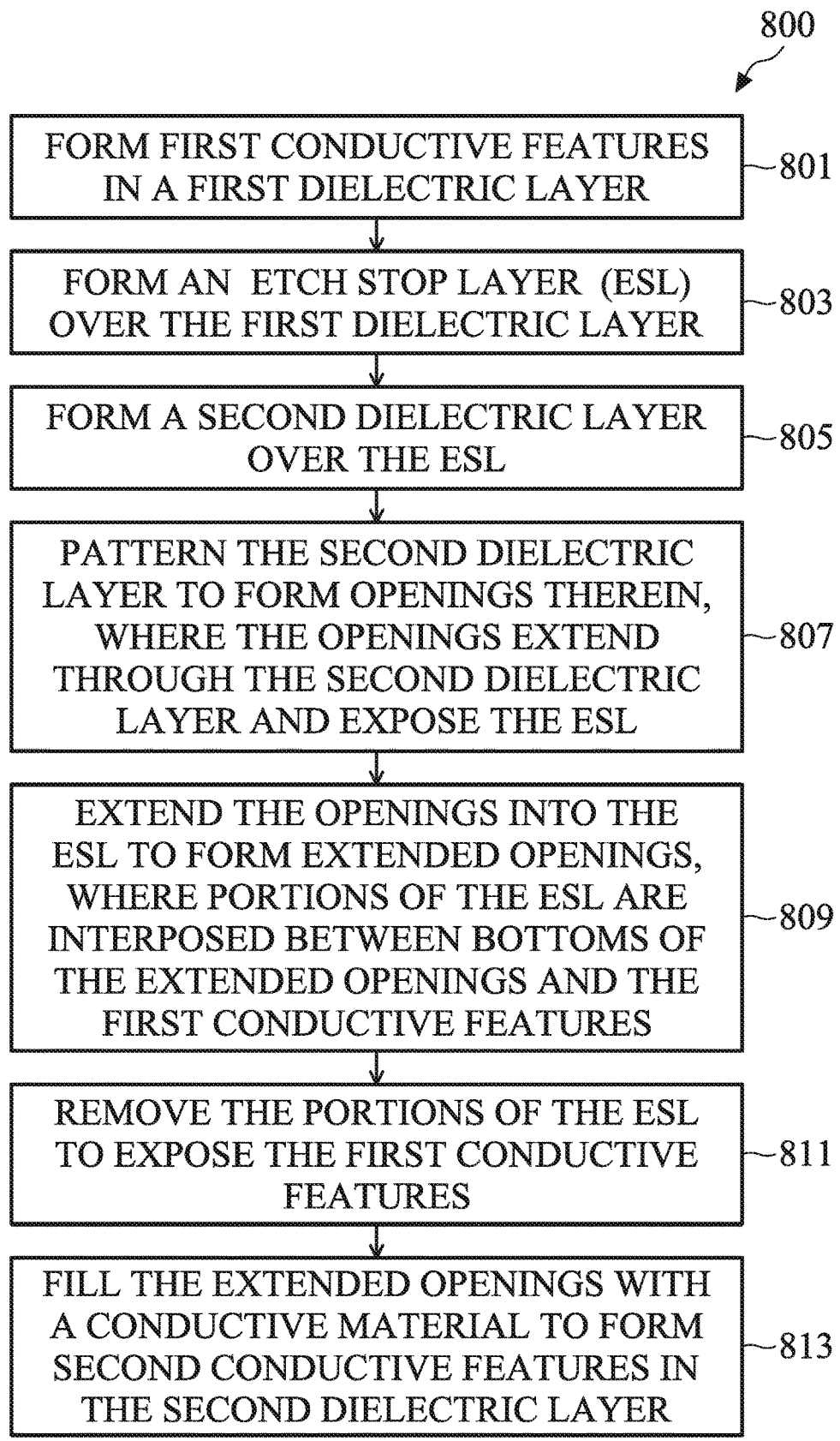
FIG. 8 is a flow diagram illustrating a method of forming a semiconductor structure in accordance with some embodiments.

FIG. 8 is a flow diagram illustrating a method 800 of forming a semiconductor structure in accordance with some embodiments. The method 800 starts with step 801, when first conductive features (such as the conductive lines $113_{M-1}$ and the conductive vias $115_{M-1}$ illustrated in FIG. 1) are formed in a first dielectric layer (such as the dielectric layer $111_{M-1}$ illustrated in FIG. 1) as described above with reference to FIG. 1. In step 803, an etch stop layer (such as the ESL 117 illustrated in FIG. 1) is formed over the first dielectric layer as described above with reference to FIG. 1. In step 805, a second dielectric layer (such as the dielectric layer $111_M$ illustrated in FIG. 1) is formed over the etch stop layer as described above with reference to FIG. 1. In step 807, the second dielectric layer is patterned to form openings (such as the openings 201 illustrated in FIG. 2) in the second dielectric layer as described above with reference to FIG. 2. In step 809, the openings are extended into the etch stop layer to form extended openings (such as the openings 401 illustrated in FIG. 4), where portions of the etch stop layer are interposed between bottoms of the extended openings and the first conductive features as described above with reference to FIGS. 3 and 4. In step 811, the portions of the etch stop layer interposed between bottoms of the extended openings and the first conductive features are removed to expose the first conductive features as described above with reference to FIG. 5. In step 813, the extended openings are filled with a conductive material to form second conductive features (such as the conductive lines $113_M$ and the conductive vias $115_M$ illustrated in FIG. 7) in the second dielectric layer as described above with reference to FIGS. 6 and 7.

Various embodiments discussed herein allow for preventing oxidation/corrosion of interconnects and allow for preventing formation of hydride and hydroxyl impurities within interconnects by not fully removing the etch stop layer formed over the interconnects while chemically etching a dielectric layer formed over the etch stop layer to form openings for subsequently formed interconnects.

According to an embodiment, a method includes forming a first conductive feature in a first dielectric layer. An etch stop layer is formed over the first dielectric layer. A second dielectric layer is formed over the etch stop layer. The second dielectric layer and the etch stop layer are patterned to form an opening, where a portion of the etch stop layer is interposed between a bottom of the opening and the first conductive feature. The portion of the etch stop layer is sputtered to extend the opening toward the first conductive feature and form an extended opening, where the extended opening exposes the first conductive feature. The extended opening is filled with a conductive material to form a second conductive feature in the second dielectric layer.

According to another embodiment, a method includes forming a first conductive feature in a first dielectric layer. An etch stop layer is deposited over the first dielectric layer. A second dielectric layer is deposited over the etch stop layer. A first mask layer is deposited over the second dielectric layer. A second mask layer is deposited over the first mask layer. A first patterning process is performed on the second dielectric layer to form an opening in the second dielectric layer, where the first mask layer and the second mask layer are used as a combined mask. The second mask layer is removed. A second patterning process is performed on the second dielectric layer and the etch stop layer to extend the opening into the etch stop layer, where a bottom of the opening is disposed within the etch stop layer after performing the second patterning process. A sputtering process is performed on the bottom of the opening to expose a portion of the first conductive feature. A conductive material is deposited into the opening to form a second conductive feature in the second dielectric layer, where the second conductive feature is in electrical contact with the first conductive feature.

According to yet another embodiment, a method includes forming a metallization layer over a substrate. A metal-doped aluminum nitride layer is deposited over the metallization layer. A dielectric layer is deposited over the metal-doped aluminum nitride layer. A first mask layer is deposited over the dielectric layer. A second mask layer is deposited over the first mask layer. A first etch process is performed on the dielectric layer to form an opening in the dielectric layer, where the first mask layer and the second mask layer are used as a combined etch mask, and where the opening exposes the metal-doped aluminum nitride layer. A second etch process is performed on the dielectric layer and the metal-doped aluminum nitride layer to extend the opening into the metal-doped aluminum nitride layer, where the first mask layer is used as an etch mask, and where a portion of the metal-doped aluminum nitride layer is interposed between a bottom of the opening and a top surface of the metallization layer after performing the second etch process. A sputtering process is performed to remove the portion of the metal-doped aluminum nitride layer and expose a conductive feature of the metallization layer. The opening is filled with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a conductive line in a first dielectric layer;
  forming a metal-doped etch stop layer over the first dielectric layer;
  forming a second dielectric layer over the metal-doped etch stop layer;
  etching the second dielectric layer and the metal-doped etch stop layer to form an opening, wherein a portion of the metal-doped etch stop layer is interposed between a bottom of the opening and the conductive line;
sputtering the portion of the metal-doped etch stop layer to extend the opening toward the conductive line and form an extended opening, wherein the extended opening exposes a top surface of the conductive line; and
filling the extended opening with a conductive material to form a conductive via in the second dielectric layer.

2. The method of claim 1, wherein the sputtering further removes a portion of the second dielectric layer.

3. The method of claim 1, wherein the sputtering is performed using ions of an inert gas.

4. The method of claim 1, wherein etching the second dielectric layer and the metal-doped etch stop layer comprises chemically etching the second dielectric layer and the metal-doped etch stop layer.

5. The method of claim 1, wherein a thickness of the portion of the metal-doped etch stop layer is between about 0.1 Å and about 0.5 Å.

6. The method of claim 1, wherein forming the metal-doped etch stop layer comprises:
depositing an aluminum nitride layer over the first dielectric layer; and
in situ doping the aluminum nitride layer with metal dopants.

7. The method of claim 6, wherein an atomic percentage of the metal dopants in the metal-doped etch stop layer is between about 5% and about 10%.

8. A method comprising:
forming a conductive line in a first dielectric layer;
depositing a metal-doped etch stop layer over the first dielectric layer;
depositing a second dielectric layer over the metal-doped etch stop layer;
performing a first patterning process on the second dielectric layer to form an opening in the second dielectric layer;
performing a second patterning process on the second dielectric layer and the metal-doped etch stop layer to extend the opening into the metal-doped etch stop layer, wherein a bottom of the opening is disposed within the metal-doped etch stop layer after performing the second patterning process;
performing a sputtering process on the bottom of the opening to expose a portion of the conductive line; and
depositing a conductive material into the opening to form a conductive via in the second dielectric layer.

9. The method of claim 8, wherein the sputtering process is performed using an inert gas.

10. The method of claim 8, wherein depositing the metal-doped etch stop layer comprises depositing a metal-doped aluminum nitride layer over the first dielectric layer.

11. The method of claim 10, wherein depositing the metal-doped aluminum nitride layer comprises:
depositing an aluminum nitride layer over the first dielectric layer; and
in situ doping the aluminum nitride layer with metal dopants.

12. The method of claim 11, wherein an atomic percentage of the metal dopants in the metal-doped aluminum nitride layer is between about 5% and about 10%.

13. The method of claim 8, wherein performing the first patterning process on the second dielectric layer comprises performing a first etch process on the second dielectric layer, the first etch process chemically etching the second dielectric layer.

14. The method of claim 13, wherein performing the second patterning process on the second dielectric layer and the metal-doped etch stop layer comprises performing a second etch process on the second dielectric layer and the metal-doped etch stop layer, the second etch process chemically etching the second dielectric layer and the metal-doped etch stop layer.

15. A method comprising:
forming a metallization layer over a substrate;
depositing a metal-doped aluminum nitride layer over the metallization layer;
depositing a dielectric layer over the metal-doped aluminum nitride layer;
performing a first etch process on the dielectric layer to form an opening in the dielectric layer, wherein the opening exposes the metal-doped aluminum nitride layer;
performing a second etch process on the dielectric layer and the metal-doped aluminum nitride layer to extend the opening into the metal-doped aluminum nitride layer, wherein a portion of the metal-doped aluminum nitride layer is interposed between a bottom of the opening and a top surface of the metallization layer after performing the second etch process;
removing the portion of the metal-doped aluminum nitride layer to expose a conductive feature of the metallization layer; and
filling the opening with a conductive material.

16. The method of claim 15, wherein the second etch process is different from the first etch process.

17. The method of claim 15, wherein removing the portion of the metal-doped aluminum nitride layer comprises performing a sputtering process using non-reactive ions.

18. The method of claim 15, wherein a thickness of the portion of the metal-doped aluminum nitride layer is between about 0.1 Å and about 0.5 Å.

19. The method of claim 15, wherein depositing the metal-doped aluminum nitride layer comprises:
depositing an aluminum nitride layer over the metallization layer; and
in situ doping the aluminum nitride layer with metal dopants.

20. The method of claim 19, wherein an atomic percentage of the metal dopants in the metal-doped aluminum nitride layer is between about 5% and about 10%.

* * * * *